United States Patent [19]

Claude

[11] 4,313,064
[45] Jan. 26, 1982

[54] INTEGRATED CIRCUIT DETECTING THE CHARACTERISTIC OF AN EXTERNAL SYSTEM

[75] Inventor: Mutrux Claude, Marin, Switzerland

[73] Assignee: Ebauches Electroniques SA, Marin, Switzerland

[21] Appl. No.: 145,405

[22] Filed: Apr. 30, 1980

[30] Foreign Application Priority Data

May 31, 1979 [CH] Switzerland ............... 5069/79

[51] Int. Cl.³ ........................................... H03K 19/12
[52] U.S. Cl. ................................. 307/475; 307/308; 307/DIG. 1
[58] Field of Search ............... 307/203, 308, DIG. 1

[56] References Cited

U.S. PATENT DOCUMENTS 4,001,808  1/1977  Ebihara et al. ............... 340/336
4,011,507  3/1977  Rossell .......................... 324/127

FOREIGN PATENT DOCUMENTS

80/00038  3/1979  World Intel. Prop. Org. ..... 340/336

OTHER PUBLICATIONS

"Continuous Monitor . . . ", by Kenneth Wellington Electronics, vol. 47, No. 8, Apr. 18/74, p. 118.

*Primary Examiner*—Harold A. Dixon
*Attorney, Agent, or Firm*—Wender, Murase & White

[57] ABSTRACT

The integrated circuit comprises an output circuit feeding an external system connected to an output terminal of the integrated circuit and a detection circuit of the characteristic of the external system. The detection circuit includes a comparator for comparing the voltage on the output terminal in response to a signal delivered by the output circuit with a voltage of reference, memorizing means memorizing at different times the result of the comparison and a logic circuit connected to the memorizing means which delivers at its outputs combinations of logic states depending upon the characteristics of the external systems, the combinations of logic states being utilized by the integrated circuit to control the external systems in accordance with their particular characteristics.

8 Claims, 11 Drawing Figures

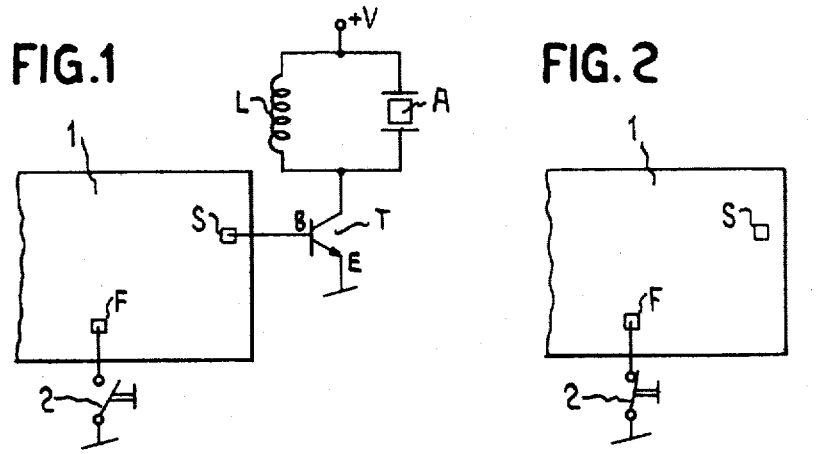
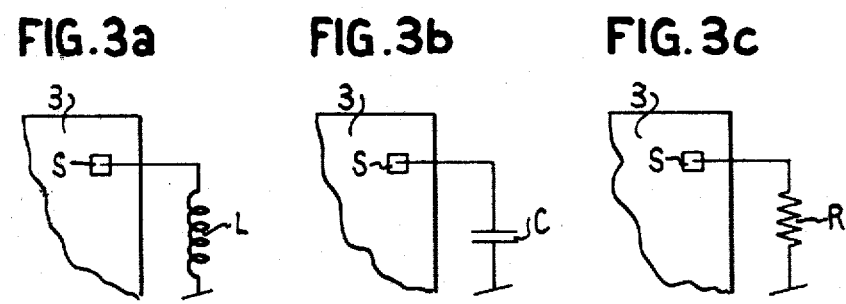
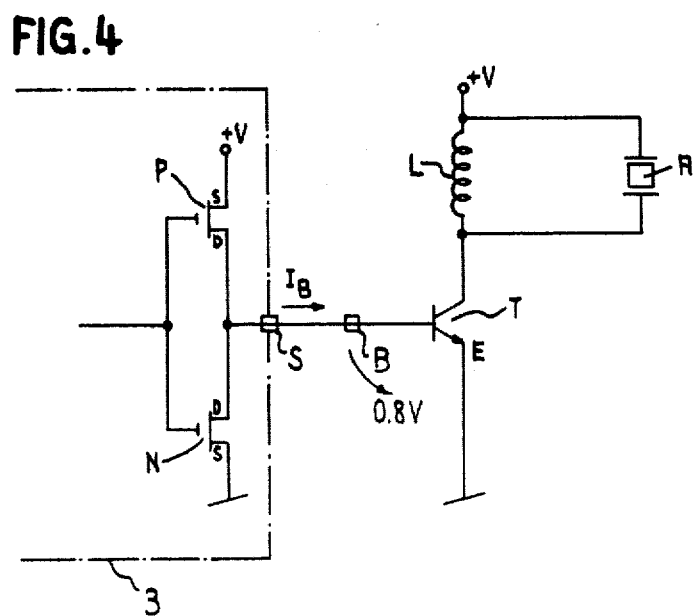

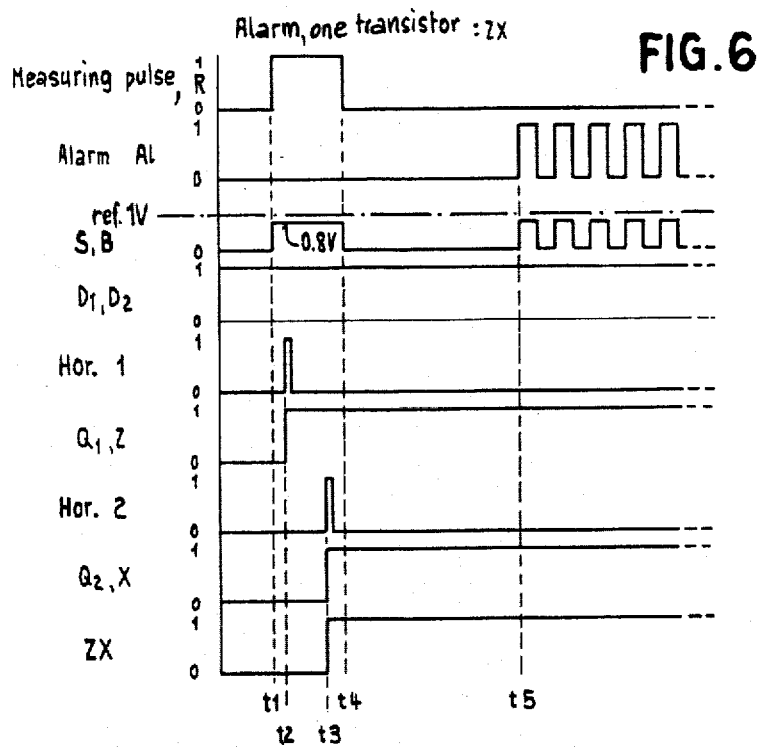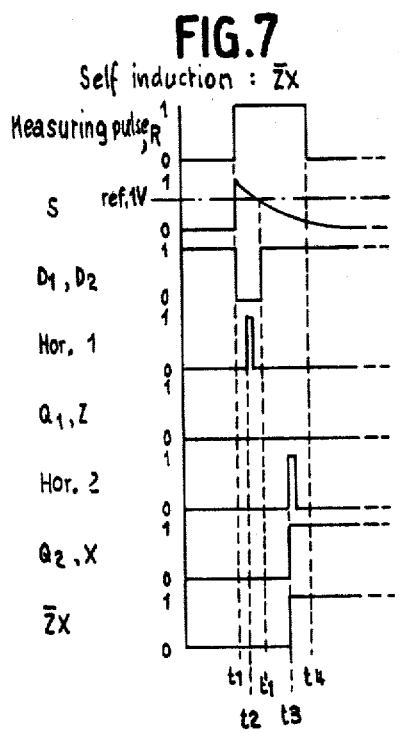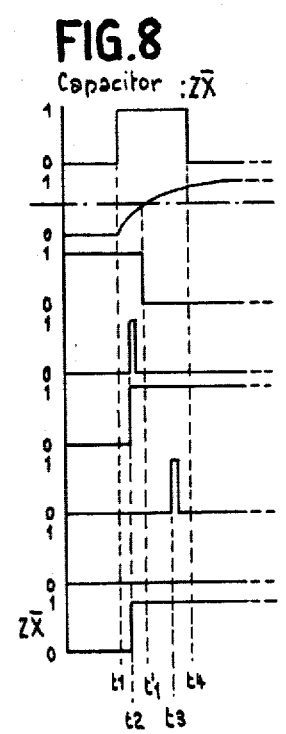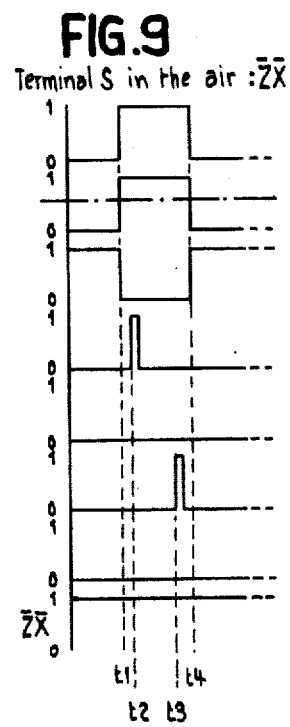

INTEGRATED CIRCUIT DETECTING THE CHARACTERISTIC OF AN EXTERNAL SYSTEM

BACKGROUND OF THE INVENTION

The present invention relates to an integrated circuit detecting the characteristic of an external system, said integrated circuit comprising at least one output circuit means connected to an output terminal for controlling a plurality of various external systems capable to be connected to said terminal.

During the design and the construction of electronic systems it is often required to provide a same basic circuit, for example the integrated circuit of the system, for controlling various kind of external circuits, in order that the basic circuit be utilized for many different applications. It is then necessary to have means for distinguishing the different variants of external circuit and for indicating to the basic circuit what is the variant to be controlled.

Generally, such an indication is given by an electric connection on a particular input line. However, such a principle presents the following drawbacks:

- it is in principle necessary to provide the basic circuit with a separate input terminal for each variant of external system to be controlled. This is particularly unfavourable if the basic circuit is an integrated circuit because of the price of the additional terminals and the prohibitive place taken by these terminals,
- it is necessary, in the course of the assembly, to provide a particular connection in accordance with the foreseen application of the device,
- there exists a risk of error in the establishment of this connection.

The published PCT application WO 80/00038 describes a device for monitoring the seven segments of a liquid crystal display which permits the automatic determination, by use of the capacitive behaviour of the display, of the faulty or short circuit segments. Such a device is very specific and it does not allow to control various kind of external circuits with a same basic internal circuit.

The document "ELECTRONICS, Vol. 47, no 8, Apr. 18, 1974, page 118", relates to a continuous monitor for seven-segments displays. It describes a circuit for automatic testing each segment of the seven-segment digital display at the rate of one segment every second. The device is also very specific and it applies only for incandescent or light-emitting-diode displays.

SUMMARY OF THE INVENTION

The present invention seeks to overcome the preceding drawbacks by providing an integrated circuit comprising only one output terminal for controlling a plurality of various external systems, the integrated circuit detecting the characteristic of an external system connected to this output terminal and controlling this system in accordance with its particular characteristic.

According to the invention, there is provided an integrated circuit detecting the characteristic of an external system, said integrated circuit comprising at least one output circuit means connected to an output terminal for controlling a plurality of various external systems capable to be connected to said terminal, a detection circuit including comparison means of the voltage on said output terminal with a voltage of reference, memorizing means connected to said comparison means for storing the result of said comparison and logic circuit means connected to said memorizing means for delivering at their outputs combinations of logic states depending upon said characteristics of the external systems, said combinations of logic states permitting said integrated circuit to control said external systems in accordance with their particular characteristics.

BRIEF DESCRIPTION OF THE DRAWINGS

The present invention will be described further, by way of example, with reference to the accompanying drawings, in which:

FIG. 1 shows a conventional integrated circuit utilized for an alarm clock,

FIG. 2 shows the integrated circuit of FIG. 1 utilized for a watch indicating time zones, FIGS. 3a, 3b and 3c illustrate three different external elements connected to a same output terminal of an integrated circuit according to the invention, FIG. 4 illustrates detailed electronic circuit for use with FIG. 1 alarm clock circuit.

FIGS. 6, 7, 8 and 9 show the diagrams of the signals at various points of the circuit of FIG. 5, in the respective cases of external circuits like an alarm circuit, a self induction, a condenser and in the absence of an external element.

DESCRIPTION OF THE PREFERRED EMBODIMENT

Figure 5:
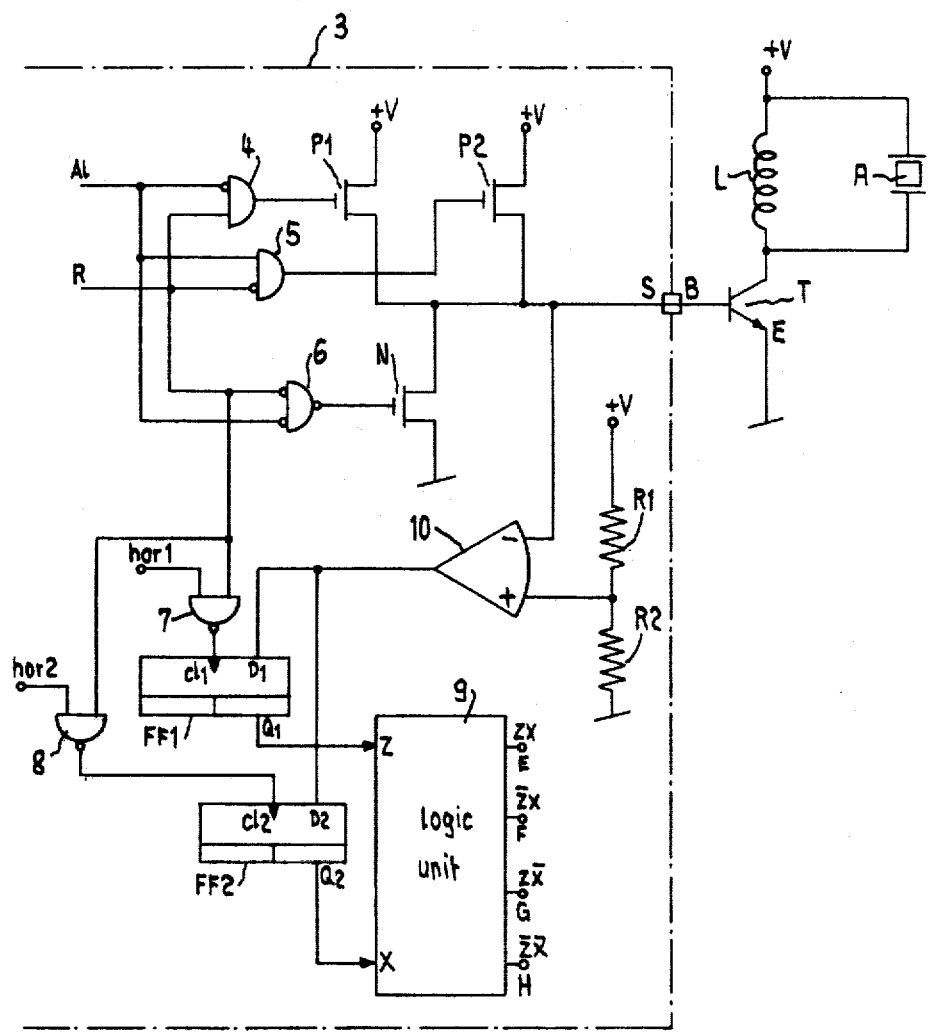
FIG. 5 shows the schematic diagram of part of the electronic circuit of the integrated circuit according to the invention.

The integrated circuit of FIG. 1 is conventional and it is utilized as a basic circuit for controlling via the terminal S an external alarm circuit. This alarm circuit comprises a transistor T the base B of which is connected to the terminal S and the emitter E to the negative pole of the supply. An electroacoustic transducer A with its excitation coil L is inserted between the positive pole of the supply and the collector of the transistor T. The integrated circuit 1 further comprises a second terminal F for the purpose of indicating to the integrated circuit if it must feed the alarm circuit (terminal F open) or if it must indicate the hour of another time zone (terminal F connected to the negative pole of the supply). The terminal F is connected to an external switch 2 which, in the case of the FIG. 1, is open because the circuit 1 is foreseen to feed the alarm circuit. FIG. 2 shows the integrated circuit 1 of FIG. 1 in the case where this circuit is foreseen to indicate the hour of another time zone. In this case the terminal S is in the air and the switch 2 is closed, so that the terminal F is at earth. FIGS. 1 and 2 show that, in the case of a conventional integrated circuit utilized as a basic circuit, each particular application corresponds to a particular terminal of the circuit and that external elements to be controlled by the circuit must be connected to their corresponding terminal.

FIG. 3 shows an integrated circuit 3 according to the invention, utilized as a basic circuit for controlling via a same and unique terminal S a plurality of external elements such as the self induction L of a buzzer in FIG. 3a, a condenser C or a cell of a LCD (liquid crystal display) display in FIG. 3b or a resistor or a transistor in FIG. 3c. A particular case corresponds to the absence of external element, which means that the terminal S is in the air.

In the case of the alarm clock of FIG. 1, FIG. 4 shows the detailed schematic diagram of the conventional electronic circuit utilized for the control of the alarm. The integrated circuit 3 comprises an output stage formed by the complementary MOS transistors P and N connected as an inverter. The output of the inverter is connected to the output terminal S of the circuit 3, terminal to which is connected the base B of the transistor T feeding the electroacoustic transducer A.

FIG. 5 shows the modifications and the additional circuits which it is necessary to add to the schematic diagram of FIG. 4 in order to obtain the electronic circuit according to the invention, permitting to recognize and to control a plurality of variants of external elements or circuits, including the case of the absence of these circuits, via a same and unique terminal S of the integrated circuit 3.

The electronic circuit of FIG. 5 is part of the integrated circuit 3 which is forseen as a basic circuit for a plurality of different applications. It is clear that the circuit 3 comprises besides of the circuit shown in FIG. 5, a plurality of other electronic circuits not represented. The schematic diagram of FIG. 5 comprises an AND gate 4 an inverted input of which receiving an alarm signal Al is connected to an input of an AND gate 5 and to an inverted input of a NAND gate 6. The second input of gate 4 is connected to a measuring signal R, to an inverted input of gate 5, to an inverted input of gate 6, to an input of a NAND gate 7 and to an input of a NAND gate 8. The output of gate 4 is connected to the gate of a MOS transistor P1 the source of which is connected to the positive pole of the supply and the drain to the drain of a MOS transistor P2, to the output terminal S and to the drain of a MOS transistor N. The output of gate 5 is connected to the gate of transistor P2 the source of which is connected to the positive pole of the supply. The output of gate 6 is connected to the gate of transistor N the source of which is connected to the negative pole of the supply. The terminal S is also connected to the inverted input of a comparator 10 the direct input of which is connected to the common point of two resistors R1 and R2 connected in series between the positive and the negative poles of the supply. The voltage delivered at the direct input of comparator 10 by the voltage divider R1/R2 is a voltage of reference. The output of the comparator 10 is connected to the input D1 of a D-flip-flop FF1 and to the input D2 of a D-flip-flop FF2. The clock input Cl1 of FF1 is connected to the output of gate 7 the second input of which receiving from the integrated circuit a clock pulse hor 2. The output Q1 of FF1 is connected to the input Z of a logic circuit 9 having the function of a decoder. The output Q2 of FF2 is connected to the input X of the same logic circuit 9. The outputs of the circuit 9 are on the integrated circuit 3. They permit the integrated circuit to recognize the variants of external elements or circuits connected to the terminal S and to control these elements or circuits in accordance with their particular characteristics. The logic states of the outputs of the circuit 9, like E, F, G and H correspond respectively to the logic configurations ZX, ZX, ZX and ZX.

We shall now examine with the help of the diagrams of FIGS. 6, 7, 8 and 9 the operation of the circuit of FIG. 5 for some cases of possible applications.

The diagram of FIG. 6 corresponds to the case of the alarm clock of FIG. 1. In this case, as indicated in FIG. 5, the base of transistor T is connected to the output terminal S of the integrated circuit 3. At time t1, the inverted input of gate 5 receives a measuring signal R delivered by the integrated circuit. The inverted input of gate 4 is maintained at zero by the signal Al. In these conditions, the output of gate 4 is at the logic state 1 as is the output of gate 6 while the output of gate 5 is at the logic state 0. From these conditions it results that transistor P1 is conducting and that the transistors N and P2 are blocked. Transistor P1 controls via terminal S the transistor T which is conducting, its base-emitter voltage being about 0.8 V. If one admits that the reference voltage on the direct input of comparator 10 is greater than the base-emitter voltage of T, for example 1 V, the output of the comparator is at the logic state 1 as are the inputs D1 and D2 of the flip-flops FF1 and FF2.

The integrated circuit delivers at time t2, during the measuring pulse, a clock pulse hor 1 which is transmitted through gate 7 to the clock input Cl1 of FF1 which switches over so that its output Q1 changes to the logic state 1. The input Z of the logic circuit 9 is therefore at the logic state 1. A little later, but still during the measuring pulse, at time t3, the integrated circuit delivers a clock pulse hor 2 to gate 8 which transmits it to the clock input C12 of FF2 which switches over so that its output Q2 changes to the logic state 1. The input X of the logic circuit 9 is therefore at the logic state 1. In this example, it is to be seen that after the time t3, both inputs Z and X of the circuit 9 are at the logic state 1, so that the logic state of the output E of circuit 9 which corresponds to the logic configuration E=ZX is also at the logic state 1. The outputs F, G and H of circuit 9 are at zero. Therefore, the combination of the following logic states: E=1, F=G=H=0 indicates to the integrated circuit that a transistor T is connected to the terminal S. The same result would be obtained if the transistor T would be replaced by a resistor the voltage drop over which would be smaller than the voltage of reference. The preceding shows that the pulse which is applied at time t1 at the terminal R is a measuring pulse permitting to detect the kind of external circuit which is connected to the terminal S. The internal resistance of transistor P1 which is conducting during the measurement is choosen in the order of magnitude of the resistance of the external circuit to be measured, so that the voltage division at terminal S has a suitable value. The internal resistance of transistor P2, which has the function of feeding the external circuit, is choosen of a smaller value than the one of P1.

Let us see now, in the preceding example, what happens in the circuit at the end of the measuring pulse, at time t4 and at time t5, when the alarm is switched on. At time t4 the measuring pulse R goes to 0 so that both signals Al and R are at the logic state 0. The transistor P1 becomes non conducting, the transistor P2 remains blocked and the transistor N becomes conducting. Transistor T becomes not conducting, the voltage at terminal S being practically 0. This has no effect on the output of the comparator 10 which remains at the logic state 1. Gates 7 and 8 being closed, the flip-flops FF1 and FF2 no longer receive clock pulses so that their outputs Q1 and Q2 remain at the logic state 1. The above indicated particular combination of the logic states at the output terminals E, F, G and H of circuit 9 permits for the integrated circuit to recognize that a transistor is connected to the terminal S and to control this transistor so that an alarm is given at time t5. Therefore, the integrated circuit delivers at time t5 an alarm signal Al which renders transistor P2 periodically conducting and transistor N periodically blocked so that this alarm signal appears on terminal S for controlling the transistor T as required.

The preceding shows that during the measuring pulse R the circuit is capable to determine that an external circuit like a transistor or a resistor is connected to the output terminal S and to deliver a combination of logic states characterizing this particular external circuit. These logic states are then utilized by the integrated circuit for delivering at time t5, at the alarm time, an alarm signal capable of correctly controlling the transistor T.

Let us examine now by reference to FIG. 7 what happens in the circuit of FIG. 5 when a self induction L, for example the coil of a buzzer, is connected to the output terminal S. Like in the preceding case, a measuring pulse R is applied to the circuit at time t1. The transistor P1 is conducting and the transistors P2 and N are blocked so that the pulse appears at the terminal S, over the self induction L. The voltage over the self induction L then decreases exponentially from the level 1, with a determined time constant. Between the time t1 and a later time t1' the voltage on the terminal S is greater than the voltage of reference so that, during this time interval, the output of the comparator 10 as well as the inputs D1 and D2 of the flip-flops FF1 and FF2 are at the logic state 0. At time t1', the voltage on the terminal S falls under the value of the voltage of reference and the inputs D1 and D2 change from the logic state 0 to the logic state 1. At time t2, during the measuring pulse and while the inputs D1 and D2 are still at 0, the circuit receives a clock pulse hor 1 which is transmitted to the flip-flop FF1 by the gate 7. This pulse does not switch over the flip-flop the output Q1 of which remaining at the logic state 0. At time t3, the circuit receives a further clock pulse hor 2 which is transmitted to the flip-flop FF2 by gate 8. It is to be seen that the pulse hor 2 appears when the inputs D1 and D2 have already change to the logic state 1 so that the flip-flop FF2 switches over, its output Q2 changing to 1. After the time t3, the input Z of circuit 9 is at 0 and the input X of the same circuit is at 1. Therefore, the output F which corresponds to the logic configuration $F = \overline{Z}X$ is at 1 while the outputs E, G and H are at 0. This particular combination of logic states permits for the integrated circuit to recognize that an inductive element L is connected to its output terminal S and to control this element in accordance with its particular characteristic.

Let us examine now with reference to FIG. 8 what happens in the circuit of FIG. 5 when a capacitor C, for example a LCD (liquid crystal display) display, is connected to the output terminal S. Like in the preceding case, the measuring pulse R is applied at time t1 to the terminal S and it charges the capacitor C, the voltage over it increasing exponentially from 0 with a determined time constant. At time t2 appears the first clock pulse hor 1 on gate 7 which transmits it to the flip-flop FF1. However, at time t2, the inputs D1 and D2 are at 1, the value of the voltage on the terminal S being still too small for changing the output of the comparator 10 to the logic state 0. From this results that at the time t2 the flip-flop FF1 switches over, its output Q1 changing to 1. At the time t1' the voltage on the terminal S becomes greater than the voltage of reference and the output of the comparator 10 as well as the inputs D1 and D2 change to 0. It follows that the second clock pulse applied at time t3 at the gate 8 is transmitted to the flip-flop FF2 which does not switch over, its output Q2 remaining at 0. After the time t2, the input Z of the circuit 9 is at 1 and the input X of the same circuit is at 0. Therefore, the output G which corresponds to the logic configuration $G = Z\overline{X}$ is at 1 while the outputs E, F and H are at 0. This particular combination of the logic states at the outputs of the circuit 9 permits for the integrated circuit 3 to recognize that a capacitive element is connected to the terminal S and to control this element in accordance with its particular characteristic. Finally, let us examine with reference to the FIG. 9 what happens in the circuit of FIG. 5 when the terminal S is in the air, no external element or circuit being connected to this terminal. The measuring pulse R is applied at time t1 to the terminal S through transistor P1 which is conducting. Because the terminal S is in the air, the voltage on this terminal increases practically to the value of the supply voltage which means to a value greater than the voltage of reference of the comparator 10. From this results that during the measuring pulse the output of the comparator 10 and the inputs D1 and D2 of FF1 and FF2 are at the logic state 0. The clock pulses hor 1 and hor 2 appearing respectively at the times t2 and t3 during the measuring pulse R do not make these flip-flops to switch over, the outputs Q1 and Q2 of which remaining at 0 as well as the inputs Z and X of the circuit 9. Therefore, the output H which corresponds to the logic configuration $H = \overline{Z}\overline{X}$ is at 1 while the outputs E, F and G are at 0. This particular combination of the logic states at the outputs of the circuit 9 permits for the integrated circuit to recognize that no element or circuit is connected to the terminal S which is in the air.

The preceding shows that the circuit according to the invention permits to recognize the kind of element or circuit which is connected to the output terminal S of the integrated circuit and to control this element or circuit in accordance with its particular characteristic. The circuit permits also to recognize that no element or circuit is connected to the terminal S. It is clear that the invention is not limited to the above mentioned elements like resistor, transistor, self induction or capacitor but that it is still valid even when a relatively complicated system is connected to the terminal S, the response of such a system to a step of voltage being supposed to be known. It is also clear that, as the case may be, the times of appearance of the clock pulses hor 1 and hor 2 must be fixed in order to permit the necessary detection of the external system connected to the terminal S. More particularly, the circuit according to the invention may be utilized for the detection of a LCD (liquid crystal display) cell for 12 h and 24 h.

In the first case, the first digit "1" is displayed by the activation of two vertical segments, while in the second case, the first digit "2" is displayed by the activation of five segments (two vertical segments and three horizontal segments), which means three segments more than in the first case. In the second case the activation of three more segments which are, in this particular application, connected together, necessitate one more connecting wire than in the first case and the circuit according the invention is capable to detect the presence or the absence of this connection. It permits also to detect a failure in a line or a connection wire as well as the presence of a lamp or of a light-emitting-diode, and so on.

I claim:

1. Integrated circuit detecting the characteristic of an external system, said integrated circuit comprising:
   at least one output circuit means connected to an output terminal for controlling a plurality of various external systems capable to be connected to said terminal, a detection circuit including comparison means of the voltage on said output terminal with a voltage of reference, memorizing means for storing the result of said comparison, and logic circuit means connected to said memorizing means for delivering at their outputs combinations of logic states depending upon said characteristics of the external systems, said combinations of logic states permitting said integrated circuit to control said external systems in accordance with their particular characteristics.

2. Integrated circuit according to claim 1, wherein said output terminal receives a measuring pulse from said output circuit means, wherein said comparison means is a comparator an input of which is connected to said output terminal, the second input of said comparator being connected to a reference voltage generator and wherein said memorizing means are flip-flops controlled by said comparator, the clock inputs of said flip-flops receiving control signals shifted in time, the outputs of said flip-flops being connected to the inputs of said logic circuit means which delivers at their outputs said combination of logic states characterizing said external systems connected to said output terminal.

3. Integrated circuit according to claim 2, wherein said measuring pulse and said control signals are delivered to said detection circuit by said integrated circuit.

4. Integrated circuit according to claim 2, wherein said control signals are delivered to the clock inputs of said flip-flops during the measuring pulse at moments of time determined in function of the characteristics of the external systems.

5. Integrated circuit according to claim 2, wherein said output circuit means comprises a first transistor the internal resistance of which is in the order of magnitude of the internal resistance of the external system connected to said output terminal and a second transistor the internal resistance of which is smaller than the internal resistance of the first transistor, both transistors being controlled by the integrated circuit by means of logic elements so that the first transistor is conducting during the measuring pulse and the second transistor is conducting when said integrated circuit controls said external system.

6. Integrated circuit according to claim 1, wherein said voltage of reference is provided by a generator of voltage of reference comprising two resistors connected in series between the positive and the negative poles of a supply feeding said integrated circuit.

7. Integrated circuit according to claim 1, wherein the detection of the characteristic of said external system is based on the response of said system to a step of voltage delivered to said output terminal by said integrated circuit.

8. Integrated circuit according to claim 1, also capable of detecting an external system having an infinite impedance corresponding to the particular case where said output terminal lies in the air.

* * * * *